(12) United States Patent  
Kawasaki

(10) Patent No.: US 8,004,020 B2  
(45) Date of Patent: Aug. 23, 2011

(54) SOLID-STATE IMAGE CAPTURING DEVICE, CAMERA MODULE AND ELECTRONIC INFORMATION DEVICE

(75) Inventor: Takayuki Kawasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 12/288,047

(22) Filed: Oct. 16, 2008

(65) Prior Publication Data

US 2009/0146235 A1    Jun. 11, 2009

(30) Foreign Application Priority Data

Oct. 17, 2007  (JP) ................................ 2007-270540

(51) Int. Cl.  
*H01L 27/146* (2006.01)

(52) U.S. Cl. .............. 257/222; 257/72; 257/98; 257/59; 257/291; 257/292; 438/70; 438/144

(58) Field of Classification Search .................... 257/59, 257/291, 292, 294, 432, 436, E31.127, 222, 257/72, 98  
See application file for complete search history.

(56) References Cited

U.S. PATENT DOCUMENTS

| | | | | |
|---|---|---|---|---|
| 5,747,790 A | * | 5/1998 | Shimomura et al. | 250/208.1 |
| 6,656,762 B2 | * | 12/2003 | Kim | 438/70 |
| 2003/0197210 A1 | * | 10/2003 | Uchida | 257/294 |
| 2006/0023313 A1 | * | 2/2006 | Kim | 359/620 |
| 2006/0145217 A1 | * | 7/2006 | Sohn | 257/294 |

FOREIGN PATENT DOCUMENTS

| | | |
|---|---|---|
| JP | 04-223371 | 8/1992 |
| JP | 2006-351761 | 12/2006 |

* cited by examiner

*Primary Examiner* — Zandra Smith  
*Assistant Examiner* — Tsz K Chiu  
(74) *Attorney, Agent, or Firm* — Edwards Angell Palmer & Dodge LLP; David G. Conlin; David A. Tucker

(57) ABSTRACT

A solid-state image capturing device includes a plurality of electrode pads for inputting and outputting a signal or voltage from and to the outside, a plurality of photoelectric conversion elements, a planarization film for planarizing the difference in the level on the surface above the plurality of photoelectric conversion elements, a microlens for focusing incident light on each of the plurality of photoelectric conversion elements, and a protection film provided above the microlens and the planarization film, the planarization film and the protection film above the plurality of electrode pads being removed as an opening, where the protection film has a protection film removing area that at least includes an area removed across all or a corner portion of the opening and the image capturing area.

25 Claims, 11 Drawing Sheets

SOLID-STATE IMAGE CAPTURING DEVICE, CAMERA MODULE AND ELECTRONIC INFORMATION DEVICE

This nonprovisional application claims priority under 35 U.S.C. §119(a) to Patent Application No. 2007-270540 filed in Japan on Oct. 17, 2007, the entire contents of which are hereby incorporated by reference.

BACKGROUND OF THE INVENTION

1. Field of the Invention

The present invention relates to a solid-state image capturing device for performing photoelectric conversions on and capturing image light from a subject, a camera module, and an electronic information device, such as a digital camera (e.g., digital video camera and digital still camera), an image input camera (e.g., car-equipped monitoring camera), a scanner, a facsimile machine, and a camera-equipped cell phone device, using the solid-state image capturing device as an image input device in an image capturing section.

2. Description of the Related Art

A cross sectional structure and method for manufacturing a conventional solid-state image capturing device described above will be described with reference to FIG. 18.

FIG. 18 is a cross sectional view schematically illustrating an exemplary essential structure of the conventional solid-state image capturing device.

As illustrated in FIG. 18, when a conventional solid-state image capturing device 100 is manufactured, a plurality of photodiodes (light receiving sections) 102 are first formed by impurity ion implantation in an image capturing area of a silicon substrate 101.

Next, a gate insulation film 103 is formed on the silicon substrate 101 by heat treatment in an oxygen atmosphere, and subsequently, a gate electrode 104 for transferring a signal charge generated by photoelectric conversions at the photodiode 102 towards the side of an output circuit is formed by a decompression CVD method for poly-silicon and the like.

Subsequently, a light shielding film (not shown) is formed with a material such as tungsten in an area other than the photodiode where light above the gate electrode 104 enters, and an interlayer insulation film 105, such as a BPSG film (which is a silicon oxide film including phosphorus and boron), is formed. A reflow process (heat treatment) is performed to eliminate the difference in the level on the surface so as to planarize it.

Further, although not shown herein, a metal layer, which will be a wiring of a peripheral circuit and a gate electrode, is formed on the interlayer insulation film 105 by a single layer of a material, such as Al.Al—Si.Al—Cu, or a multilayer film of such material and TiN.Ti.TiW and the like. At this stage, a plurality of electrode pads 106 for inputting and outputting a signal with the exterior of the device are simultaneously formed in the outer circumference edge section of the solid-state image capturing device 100 (device chip or solid-state image capturing chip).

Although not shown herein, a passivation film is formed with a material such as plasma SiN (P-SiN) and plasma SiON (P-SiON) above a metal layer that will be a wiring of a peripheral circuit and a gate electrode, and subsequently, a passivation film is removed above the electrode pad. These portions, so far, form the portions performing solid-state image capturing functions and all the material used so far to form films are inorganic materials.

The step subsequent to this is the formation of optical system portions for separating colors and focusing light of image capturing elements, and almost all of them are formed with organic materials.

First, a planarization film 107 for planarizing the foundation for forming a color filter is formed by spin-coating a transparent organic material, and the planarization film 107 above the electrode pad 106 is etched and removed so as to expose the electrode pad 106 again.

A color filter 108 is formed above the electrode pad 106 and the planarization film 107 by photolithography process. The color filter 108 will have a color arrangement of R, G and B, such as the Bayer arrangement, when the plurality of color filters 108 are the primary colors. The color filter 108 will have a color arrangement of Cy (cyan), Mg (magenta) and Ye (yellow) when the plurality of color filters 108 are the complementary colors. In the photolithography process, the exposed surface of the electrode pad 106 may be exposed to a developing solution or a material of the color filter 108 may appear on the exposed surface as a residue. Note that, although filters formed in the color filters of complementary colors are in three colors of Cy (cyan), Mg (magenta) and Ye (yellow), the filter arrangement is a four color arrangement including Gr (green), which is formed by overlapping the Cy (cyan) and Ye (yellow).

Next, a planarization film 109 as a foundation layer for forming a microlens 110 is formed by spin-coating a transparent organic material on the color filter 108, and the planarization film 109 above the electrode pad 106 is etched and removed so as to expose the electrode pad 106 again.

Subsequently, the microlens 110 for focusing incident light on the photodiode 102 is formed by the photolithography process and baking process of a transparent organic film material.

In this case, the electrode pad 106 may be exposed to a developing solution by the photolithography process in a state with the exposed electrode pad 106, and a residue of the color filter 108 may appear above the electrode pad 106, which will result in a poor wire bonding to the electrode pad 106. Although the roughness and the residue of the electrode pad 106 can be removed by plasma ashing, an organic material such as a microlens material is also exposed to plasma ashing, resulting in roughness of the surface of the microlens 110 itself and damaging it.

For such a damage to the microlens 110, a protection layer 111, which is formed by an organic or inorganic SOG film (Spin on Glass), CVD-SiO$_2$ film and the like, is formed, and an opening is formed by the photolithography process of the protection layer 111, and subsequently an ashing process is performed in a state having a resistor subsequent to the removal of a resist.

For this problem, Reference 1 discloses a way to further add an improvement to the conventional method described above. The conventional method described above uses a method for removing a film above the electrode pad 106 every time a film of an organic material is formed. However, the film above the electrode pad 106 is not removed and left intact. Subsequent to the formation up to and including the microlens 110, an opening is resist-patterned above the electrode pad 106, and the organic film is totally etched and removed at once above the electrode pad 106 by dry etching such as O$_2$/CF$_4$ plasma. The problem described above can be solved by this method.

In recent image capturing devices, the protection film 111 above the microlens 110 is substantially formed not for the function of the protection film 111 provided against the damage of the microlens 110 but for the function of a reflection preventing film for preventing the reflection of light that enters the microlens 110.

Reference 2 discloses this reflection preventing film. In Reference 2, a film with a material having a lower refractive index than a microlens material (transparent organic material with refractive index of 1.6) is laminated above the microlens so as to prevent reflection on the microlens surface. As a result, light focused on the photodiode can be increased. Conventionally, such reflection preventing film is formed by laminating a silicon oxide film ($SiO_2$) with a refractive index of 1.45 by the CVD method and the like.

Reference 1: Japanese Laid-Open Publication No. 2006-351761

Reference 2: Japanese Laid-Open Publication No. 4-223371

SUMMARY OF THE INVENTION

Among makers that use a recent solid-state image capturing device, some of them desire reflow soldering for the purpose of downsizing of a product and an automation of installing. The reflow soldering is performed by mounting a terminal taken out of a packaged solid-state image capturing device to a terminal on a substrate with solder and putting them in a high temperature tank with a high temperature at which the microlens surface is bearable and soldering can be performed. In addition, as a usage for such a solid-state image capturing device, more makers use it as a sensor (car-equipped monitoring camera) for a vehicle. For such reflow installation and such usage for a vehicle, a high heat stress is applied to the solid-state image capturing device which was not experienced conventionally. Due to this heat stress, a crack occurs in the protection layer (or the reflection preventing film) above the microlens in the conventional structure. This crack is a crack X due to the difference between the qualities of films between the protection film and the organic film, and a problem occurs when the crack X reaches an effective image capturing pixel area E of the image capturing area and a linear crack X appears in a captured image, appearing in a display screen as an image defect.

A photograph through an optical microscope of such linear crack of an actual protection film (or reflection preventing film) is illustrated in FIG. 19.

As a result of various experiments and analyses, it is known that the crack X occurs from a corner portion P1 of a quadrilateral in a plan view of an opening pattern P for removing organic planarization films 107 and 109, and the protection film 111 (or the reflection preventing film) above the electrode pad 106, as illustrated in FIG. 19. Conventional grappling with the crack X will be described with reference to FIGS. 20 to 23. In the conventional example in FIG. 18, the organic film removing pattern above the electrode pad 106 is an opening pattern smaller than the electrode pad 106. However, in FIGS. 20 to 23, an opening pattern P, which is opened larger than the electrode pad 106, is used as an actual pattern that is currently used. F1 in FIG. 20 illustrates an edge surface in an ineffective pixel area F, where the plurality of electrode pads 106 are formed, on the outer side of the effective pixel area E, which is an image capturing area.

FIGS. 20 to 23 are based on analysis results that the crack X decreases when the generated crack X reaches a pattern portion with unevenness (effective image capturing pixel area E) of the microlens 110, and the crack X is controlled by relieving the stress by the uneven portion of the lens surface. In an actual state, a microlens pattern 112 is positioned with the same material as the microlens 110 and is positioned in a microlens forming step in such a manner to surround the opening pattern P above the electrode pad 106 as illustrated in FIG. 22. The cross sectional structure in such a case is illustrated in FIG. 23, where the microlens pattern 112 is positioned in the ineffective pixel area F between the electrode pad 106 and the effective pixel area E.

However, it is known that the crack X of the protection film 111 (or the reflection preventing film) cannot be completely prevented even though the crack X can be relieved. That is, although the crack X is decreased by reaching the uneven portion of the microlens 110, it appears as a linear image display defect when captured. This means that the stretching of the crack X does not stop before the microlens 110, and this indicates that the stretching of the crack X will not be certainly prevented if a stronger stress is applied even when the electrode pad 106 is surrounded by the aforementioned microlens pattern 112 in FIG. 22 and a method for preventing the stretching of the crack X is performed.

The present invention is intended to solve the conventional problems described above. The objective of the present invention is to provide a solid-state image capturing device and a camera module, which are capable of certainly preventing the stretching of the crack even when a stronger heat stress is applied, and an electronic information device, such as a car-equipped monitoring camera and a camera-equipped cell phone device used in an image capturing section as an image input device.

A solid-state image capturing device according to the present invention includes a plurality of electrode pads provided in a outer circumference edge section of a semiconductor substrate, for inputting and outputting a signal or voltage from and to the outside; a plurality of photoelectric conversion elements provided in an image capturing area inside the outer circumference edge section of the semiconductor substrate; a planarization film for planarizing the difference in the level on the surface above the plurality of photoelectric conversion elements; a microlens provided above the planarization film, for focusing incident light on each of the plurality of photoelectric conversion elements; and a protection film provided above the microlens and the planarization film, the planarization film and the protection film above the plurality of electrode pads being removed as an opening, wherein the protection film has a protection film removing area that at least includes an area removed across all or a corner portion of the opening and the image capturing area, thereby achieving the objective described above.

Preferably, in a solid-state image capturing device according to the present invention, only a protection film above the planarization film is removed in the protection film removing area.

Still preferably, in a solid-state image capturing device according to the present invention, a pattern of the protection film removing area is a belt-shaped pattern surrounding all the image capturing area with a predetermined width.

Still preferably, in a solid-state image capturing device according to the present invention, a pattern of the protection film removing area is a belt-shaped pattern positioned linearly crossing a predetermined width between the plurality of electrode pads and the image capturing area.

Still preferably, in a solid-state image capturing device according to the present invention, the belt-shaped pattern is provided along one edge to the other edge that face each other.

Still preferably, in a solid-state image capturing device according to the present invention, a pattern of the protection film removing area is a belt-shaped pattern surrounding a corner portion of the side of the image capturing area in the opening with a predetermined width.

Still preferably, in a solid-state image capturing device according to the present invention, the belt-shaped pattern has the predetermined width of 1 to 10 µm.

Still preferably, in a solid-state image capturing device according to the present invention, a pattern of the protection film removing area is an area including the opening.

Still preferably, in a solid-state image capturing device according to the present invention, the area including the opening is an area outside an imaginary line across the opening and the image capturing area.

Still preferably, in a solid-state image capturing device according to the present invention, the area including the opening is an area outside an imaginary line surrounding all the image capturing area.

Still preferably, in a solid-state image capturing device according to the present invention, the area including the opening is an area outside an imaginary line linearly crossing the opening above the plurality of electrode pads and the image capturing area.

Still preferably, in a solid-state image capturing device according to the present invention, a corner portion of a pattern of the protection film removing area has a curve with a radius of about 1 to 10 µm.

Still preferably, in a solid-state image capturing device according to the present invention, the protection film is a reflection preventing film that also has a reflection preventing function.

Still preferably, in a solid-state image capturing device according to the present invention, the protection film is a passivation film that also has a function to prevent the passage of water.

Still preferably, in a solid-state image capturing device according to the present invention, the reflection preventing film is a film formed of a material with a refractive index lower than the refractive index of a transparent organic material as a material of the microlens.

Still preferably, in a solid-state image capturing device according to the present invention, the reflection preventing film is an organic or inorganic, SOG (Spin on Glass) film or $SiO_2$ film.

Still preferably, in a solid-state image capturing device according to the present invention, the passivation film is at least either of a SiN film or a SiON film.

Still preferably, in a solid-state image capturing device according to the present invention, the opening is a square or rectangle in a plan view.

Still preferably, in a solid-state image capturing device according to the present invention, the solid-state image capturing device is provided with a microlens pattern having the same material as the microlens and provided in the same microlens forming step, in such a manner to surround the periphery of the opening above the electrode pad.

A camera module according to the present invention is a module in which any of the solid-state image capturing devices according to the present invention is packaged and reflow soldering is performed with a substrate terminal, thereby achieving the objective described above.

An electronic information device according to the present invention uses any of the solid-state image capturing devices according to the present invention as an image input device in an image capturing section.

The functions of the present invention having the structures described above will be described hereinafter.

A whole package is put into a high temperature atmosphere, so that a terminal on a lower surface of a resin mold package (or a ceramic package) is die-bonded to a terminal on a substrate. The package in which a solid-state image capturing device is encapsulated is a legless type, and the package is die-bonded when it is placed and heated on a land (terminal) of the substrate. Thus, the organic film (planarization film) below the protection film is soft, while the protection film such as an oxide film above the organic film is inorganic, thin and hard, thereby easy to break, and even when a strong heat stress is applied and the crack X occurs and stretches, the protection film has a protection film removing area that at least includes a removed area across all or the corner portion of the opening pattern P above the electrode pad and the image capturing area, thereby certainly stopping the stretching of the crack X in the protection film removing area. Therefore, image defects and the like will not occur even in a usage when a strong heat stress is applied to the solid-state image capturing device or even when installed in a product where a strong heat stress is applied to the solid-state image capturing device.

According to the present invention with the structure described above, the organic film (planarization film) below the protection film is soft, while the protection film such as an oxide film above the organic film is inorganic, thin and hard, thereby easy to break. Even when the crack X reaches the protection film and the crack X stretches, and even when a strong heat stress is applied in the protection film removing area, it is certainly stopped in the protection film removing area because the protection film at least includes a removed area across all or the corner portion of the opening pattern P above the electrode pad and the image capturing area.

These and other advantages of the present invention will become apparent to those skilled in the art upon reading and understanding the following detailed description with reference to the accompanying figures.

Figure 1:
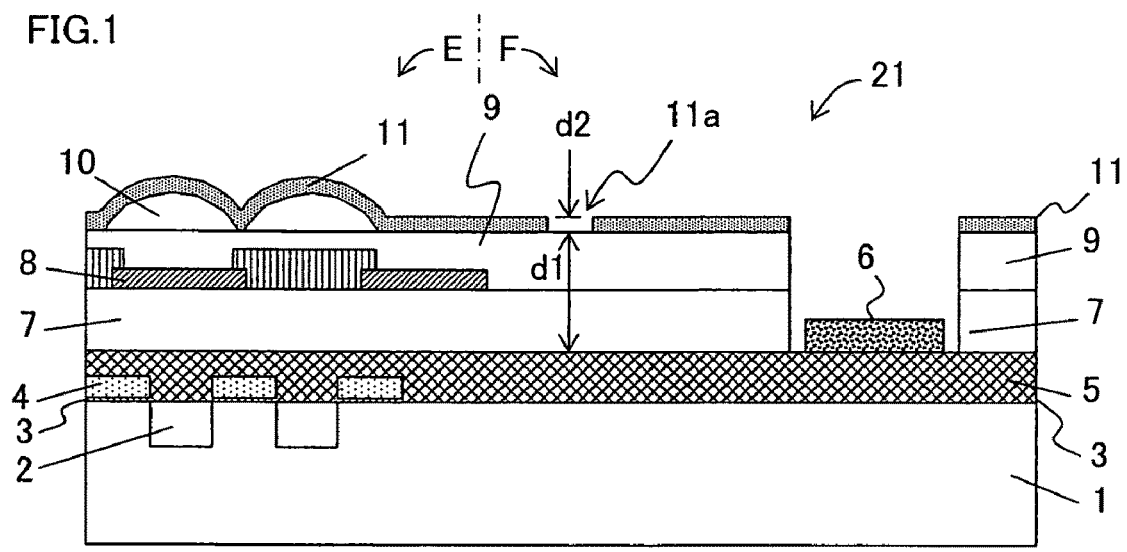
FIG. 1 is a longitudinal cross sectional view schematically illustrating an exemplary essential structure related to Embodiment 1 of the solid-state image capturing device of the present invention.

2 photoelectric conversion element
6 electrode pad
7, 9 planarization film
10 microlens
11 protection film (reflection preventing film)
11a-11g protection film removing pattern
12, 13 resist film
14 camera module
15 wire
16, 18 terminal
17 substrate
21-29 solid-state image capturing device
E effective image capturing pixel area
F ineffective pixel area
P opening pattern (opening section)
50 electronic information device
51 memory section
52 display section
53 communication section
54 image output section

DESCRIPTION OF THE PREFERRED EMBODIMENTS

Hereinafter, solid-state image capturing devices (solid-state image capturing chips) according to Embodiments 1 to 4 of the present invention, and an electronic information device according to Embodiment 5 using the solid-state image capturing device according to Embodiments 1 to 4 of the present invention as an image input device in an image capturing section, will be described with reference to figures.

Embodiment 1

Figure 2:
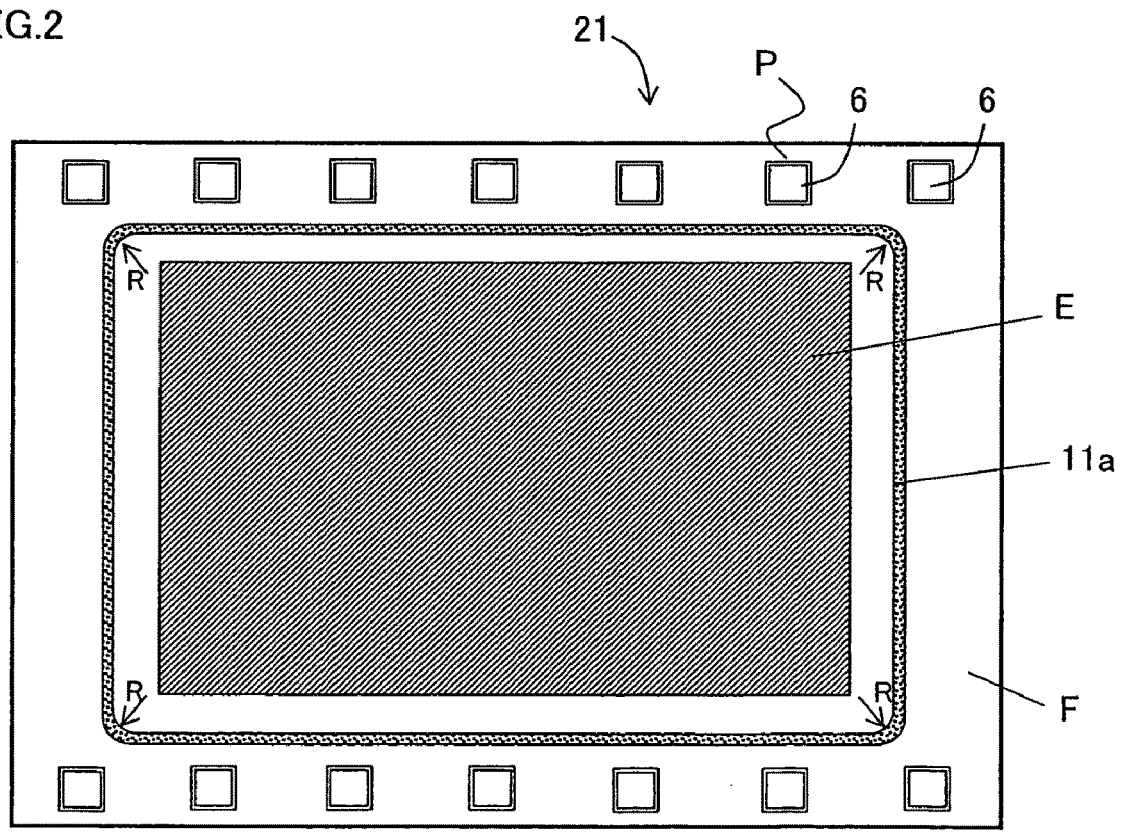
FIG. 2 is a plan view schematically illustrating the solid-state image capturing device in FIG. 1.
Figure 3:
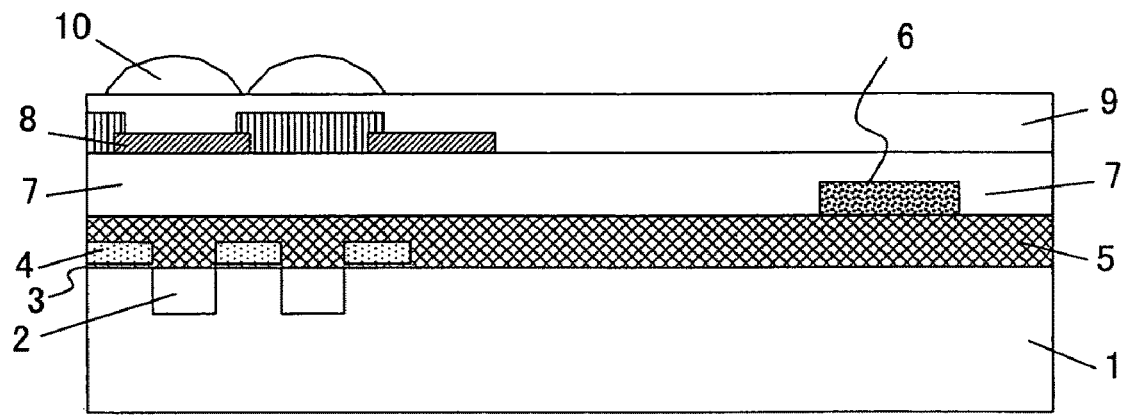
FIG. 3 is a longitudinal cross sectional view schematically illustrating an exemplary essential structure in order to describe up to and including a microlens forming step in a method for manufacturing the solid-state image capturing device in FIG. 1.

FIG. 1 is a longitudinal cross sectional view schematically illustrating an exemplary essential structure related to Embodiment 1 of the solid-state image capturing device of the present invention. FIG. 2 is a plan view schematically illustrating the solid-state image capturing device in FIG. 1.

In FIGS. 1 and 2, a solid-state image capturing device 21, which is a solid-state image capturing chip of Embodiment 1, includes: a plurality of photoelectric conversion elements 2, which are provided in an effective image capturing pixel area E that is an image capturing area inside an ineffective pixel area F of a chip's outer circumference edge section, for performing photoelectric conversions on and capturing image light from a subject; a plurality of electrode pads 6, which are provided in the ineffective pixel area F of the chip's outer circumference edge section, for inputting and outputting a signal from and to the outside; planarization films 7 and 9 for planarizing the difference in the level on the surface above the plurality of photoelectric conversion elements 2; microlenses 10, which are provided above the planarization film 9, for focusing incident light on the plurality of photoelectric conversion elements 2; and a protection film 11 provided above the microlenses 10 and the planarization film 9. The planarization films 7 and 9 and the protection film 11 above the plurality of electrode pads 6 are removed as openings (opening pattern P). The film thickness d1 of the planarization films 7 and 9 are much thicker than the film thickness d2 of the protection film 11. The film thickness d2 of the protection film 11 is about 2 to 5 μm and the film thickness d1 of the planarization films 7 and 9 may be ten times thicker than the film thickness d2 of the protection film 11.

The protection film 11 is removed by a protection film removing pattern 11a with a predetermined width of 1 to 10 μm (the narrower the width, the better it is in terms of the space) crossing between the plurality of electrode pads 6 and a forming area (effective image capturing pixel area E) of the plurality of photoelectric conversion elements 2. The belt-shaped protection film removing pattern 11a (protection film removing area) removes only the protection film 11 above the planarization film 9, and the planarization film 9 is not removed. Further, the protection film removing pattern 11a is a pattern that continuously surrounds the entire forming area (effective image capturing pixel area E) of the plurality of photoelectric conversion elements 2, and is in a shape of a rectangular peripheral section in a plan view, which is a size larger than the shape of the effective image capturing pixel area E. The four corner portions of the protection film removing pattern 11a have a curve R with a radius of about 1 to 10 μm in a plan view and curved (the larger the R is, the better it is in terms of preventing the crack occurrence) so that stress will not be applied. The corner portions are rounded so that the stress is reduced. If there is an enough space, the curve R can be larger and have a radius of 10 μm or more.

The protection film 11 is a reflection preventing film having a reflection preventing function as well as a passivation film having a function to prevent water from passing through and the like. It is an organic or inorganic, SOG (Spin on Glass) film or $SiO_2$ film. The material for the protection film 11 is at least any of organic or inorganic, SOG (Spin on Glass) film, $SiO_2$ film, SiN film, and SiON film. As described above, the protection film 11 is a pattern that completely surrounds the effective image capturing pixel area E, and the protection film 11 removes a portion that does not contribute to focus light by photolithography and dry etching (fluoric plasma) in a linear shape (linear pattern) or a belt shape (belt pattern).

Herein, the protection film 11 above the microlens 10 is used as a reflection preventing film (=silicon oxide film) in addition to the protection function. The protection film 11 controls the reflection on the microlens surface by laminating a film of a material that has a refractive index lower than the microlens material (transparent organic material with a refractive index of 1.6). As a result, a focusing light effect, which can increase light focused on the photoelectric conversion element 2 (photodiode), is improved. As such a reflection preventing film, a silicon oxide film ($SiO_2$ film) with a refraction index of 1.45 is laminated by the CVD method and the like.

A method for manufacturing a solid-state image capturing device 21 with the structure described above will be described.

In manufacturing the solid-state image capturing device 21, the plurality of photoelectric conversion elements 2 (a plurality of photodiodes), which function as a plurality of light receiving sections, are formed in two dimensions and in a matrix in row and column directions by impurity ion implantation in the effective image capturing pixel area E, which is an image capturing area at the center portion of a silicon substrate 1.

Next, a gate insulation film 3 is formed on the silicon substrate 1 by a heat treatment in an oxygen atmosphere, and a gate electrode 4, which will be a CCD structure for transferring signal charges generated by photoelectric conversions at each of the plurality of photoelectric conversion elements 2 to an output circuit, is formed by a decompression CVD method of a polysilicon and the like.

Further, a light shielding film (not shown) is formed with a metal material, such as tungsten and aluminum, in an area other than the area, such as a light receiving area, where light needs to enter. Subsequently, an interlayer insulation film 5, such as a BPSG film (which is a silicon oxide film including phosphorus and boron) is formed, and the difference in the level on the surface is planarized by the reflow process (heat treatment).

Subsequently, although not shown herein, a metal layer, which will be a wiring of a peripheral circuit and a gate electrode, is formed on the interlayer insulation film 5 by a single layer of a material, such as Al.Al—Si. and Al—Cu, or a multilayer film of such material and TiN.Ti.TiW and the like. At this stage, a plurality of electrode pads 6 for inputting and outputting a signal with the exterior of the device are simultaneously formed in the outer circumference edge section of the solid-state image capturing chip (solid-state image capturing device 21).

The planarization film 7 for planarizing the difference in the level on the surface due to the metal layer and the electrode pad 6 is formed on the metal layer and the plurality of electrode pads 6, which will be a wiring of the peripheral circuit and a gate electrode, by spin-coating a transparent organic material.

A color filter 8 is formed above the planarization film 7 by photolithography process. The color filter 8 will have a color arrangement of R, G and B, such as the Bayer arrangement, when the plurality of color filters 8 are the primary colors. The color filter 8 will have a color arrangement of Cy (cyan), Mg (magenta) and Ye (yellow) when the plurality of color filters 8 are the complementary colors. Note that, although filters formed in the color filters of complementary colors are in three colors of Cy (cyan), Mg (magenta) and Ye (yellow), the filter arrangement is a four color arrangement including Gr (green), which is formed by overlapping the Cy (cyan) and Ye (yellow).

Further, the planarization film 9 is formed on the color filter 8 by spin-coating a transparent organic film material as a foundation layer for forming the microlens 10 in order to planarize the difference in the level on the surface due to the color filter 8.

Subsequently, the microlens 10 for focusing incident light on each of the plurality of photoelectric conversion elements 2 is formed by the photolithography process and baking process of a transparent organic film material.

Figure 4:
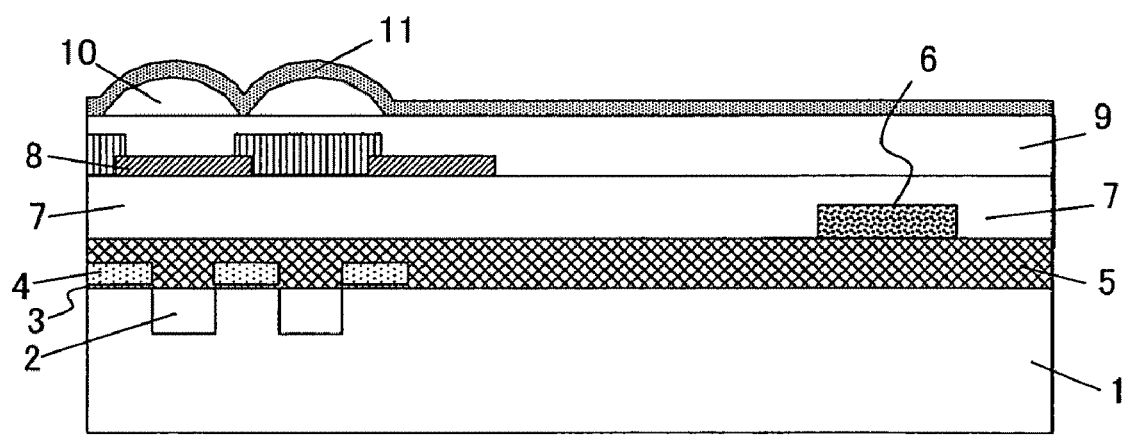
FIG. 4 is a longitudinal cross sectional view schematically illustrating an exemplary essential structure in order to describe a protection film laminating step in the method for manufacturing the solid-state image capturing device in FIG. 1.

Further, as illustrated in FIG. 4, an organic or inorganic, SOG film (Spin on Glass) or the protection film 11 formed with a CVD-$SiO_2$ film, for example, is formed as a reflection preventing film.

Figure 5:
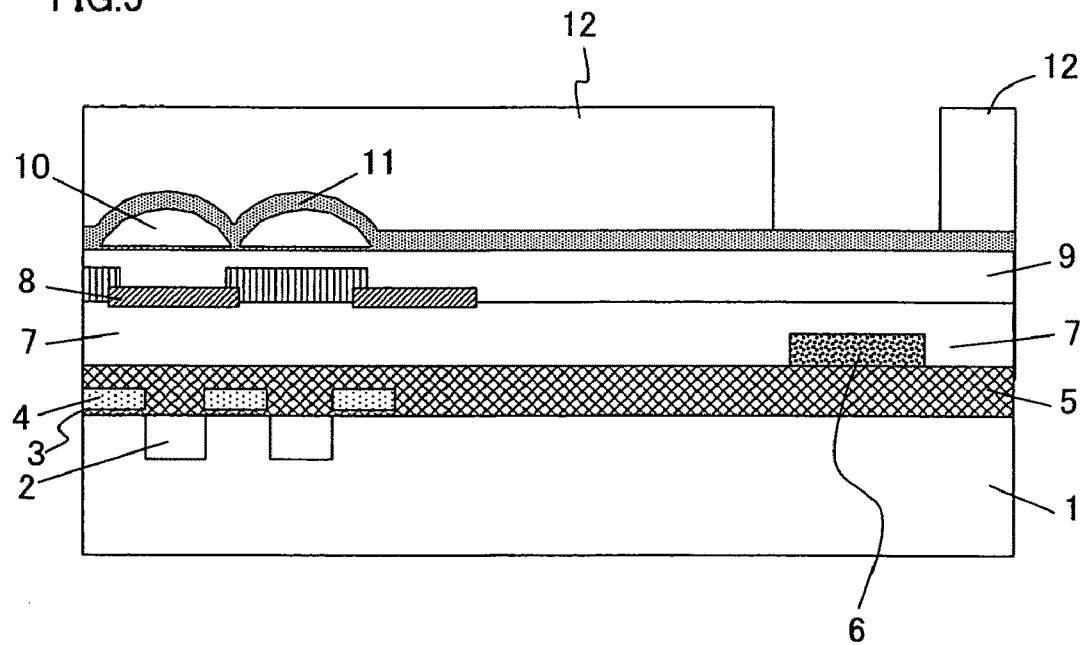
FIG. 5 is a longitudinal cross sectional view schematically illustrating an exemplary essential structure in order to describe an opening forming step in the method for manufacturing the solid-state image capturing device in FIG. 1.

Further, as illustrated in FIG. 5, a resist film 12 is patterned on the protection film 11 in such a manner that the opening pattern P, which is a size larger than each electrode pad 6, is formed. Using the resist film 12 as a mask, the organic film (the protection film 11 and the planarization films 9 and 7) are totally etched and removed at once above the electrode pad 6 by dry etching such as $O_2/CF_4$ plasma.

Figure 6:
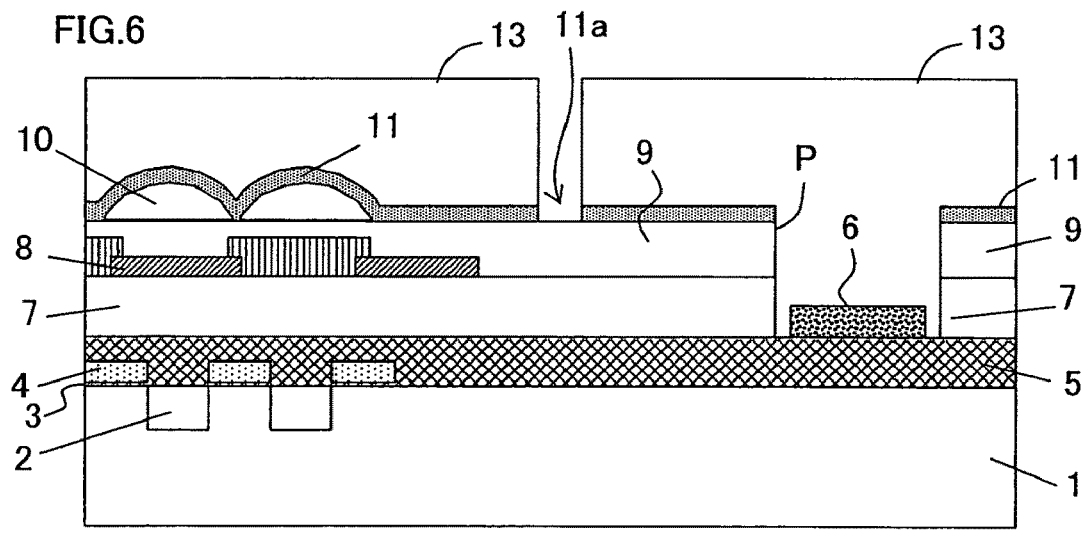
FIG. 6 is a longitudinal cross sectional view schematically illustrating an exemplary essential structure in order to describe a protection film removing pattern forming step in the method for manufacturing the solid-state image capturing device in FIG. 1.

Further, subsequent to removing the resist film 12, a resist film 13 is patterned as illustrated in FIG. 6 in such a manner that an opening in a belt shape in a plan view and in a rectangular ring shape, which will be the protection film removing pattern 11a with a predetermined width crossing between the plurality of electrode pads 6 and a forming area (effective image capturing pixel area E) of the plurality of photoelectric conversion elements 2, is included on the protection film 11. Using the resist film 13 as a mask, only the protection film 11 is etched and removed at once by dry etching such as $O_2/CF_4$ plasma.

Herein, two methods are conceivable for removing the organic film and the reflection preventing film above the electrode pad 6. One of them is a resist pattern for the opening pattern P above the electrode pad 6, is positioned together with the protection film removing pattern 11a that surrounds a pixel area (effective image capturing pixel area E), and the protection film removing pattern 11a around the pixel area (effective image capturing pixel area E) and a pattern section (opening pattern P) without a pad section of the protection film 11 (reflection preventing film) are removed by fluoric plasma treatment, and subsequently, an organic film dry etching is performed only with the opening pattern P above the electrode pad 6. The other method is, as described later, to remove the protection film 11 (reflection preventing film) only by the protection film removing pattern 11*a* around the pixel area (effective image capturing pixel area E), and subsequently, photolithography is performed only on the pattern without the pad section (opening pattern above the electrode pad 6) and successful etching is performed separately for removing the reflection preventing film and removing the organic film. Etching can be performed first for either the opening pattern P above the electrode pad 6 or the protection film removing pattern 11*a*.

It is confirmed that the crack X of the protection film 11 (reflection preventing film) occurs only in the reflection preventing film on the surface and the crack X does not reach the organic film (planarization film 9) directly below. It is also known that the starting point of the crack occurrence is at the corner portion P1 of the opening pattern P, which is a pattern for the periphery of each pad section of the plurality of electrode pads 6. Therefore, the crack X can be prevented from reaching the effective image capturing pixel area E by removing even a portion of the protection film 11 (reflection preventing film) between the pattern effective image capturing pixel area E) (opening pattern P) around the pad portion above the plurality of electrode pads 6 and the effective image capturing pixel area E. Metaphorically speaking, it is the same idea as burning trees located in the periphery in advance in order to prevent the spread of a forest fire.

In an actual device, for example, not only the metal pad (electrode pad 6) for inputting and outputting a signal as illustrated in FIG. 2, but also various electrode pads 6, such as a TEG pad (test signal inputting and outputting pad) for element characteristic evaluation, a writing pad for an internally generated voltage, are laid out. Such electrode pads 6 are all positioned in the peripheral section of the solid-state image capturing chip, which is the solid-state image capturing device 21 of Embodiment 1. Therefore, in Embodiment 1, the protection film removing pattern 11*a* surrounds all the effective image capturing pixel area E. When the pattern for the organic film above the electrode pad 6 exists only at specified edges (upper and lower edges) above the solid-state image capturing chip (solid-state image capturing device 21), the protection film removing pattern 11*a* does not have to surround all the effective image capturing pixel area E. Such a case will be described in the following Embodiment 2.

Figure 7:
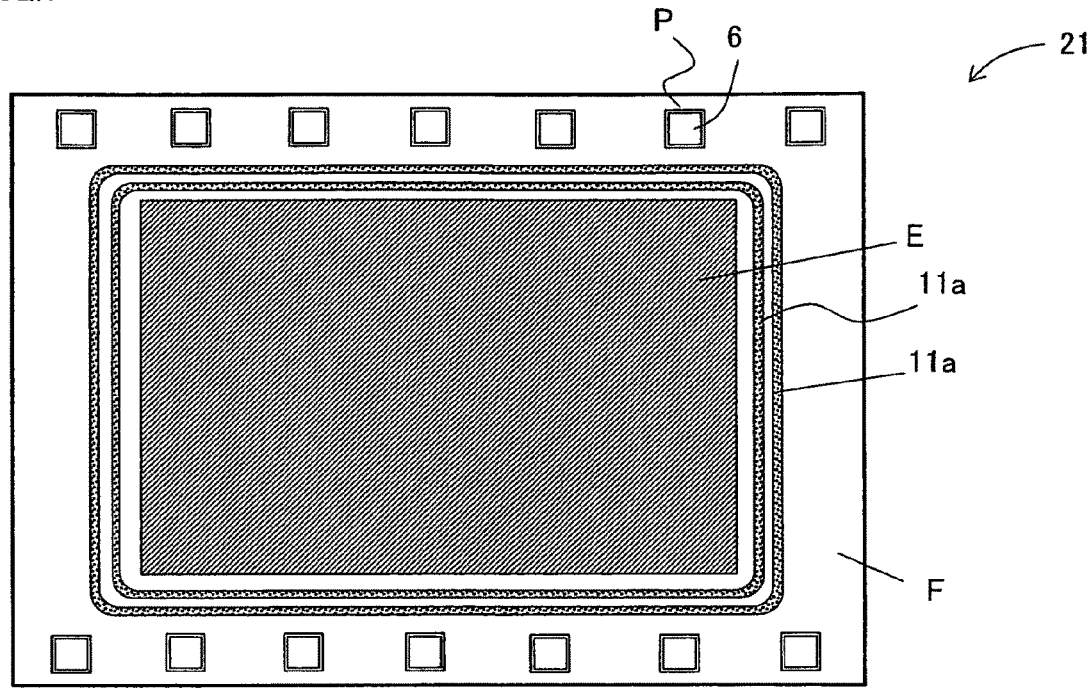
FIG. 7 is a plan view schematically illustrating another exemplary essential structure (two wide protection film removing patterns) related to Embodiment 1 of the solid-state image capturing device in FIG. 1.

In Embodiment 1 described above, the protection film removing pattern 11*a* configures a belt-shaped pattern that successively surrounds all of the forming area (effective image capturing pixel area E) of the plurality of photoelectric conversion elements 2. This pattern 11*a* has one rectangular ring shaped pattern. However, without the limitation to this, the pattern may be a plurality of rectangular ring shaped patterns. For example, it is also possible to form the protection film removing patterns 11*a* illustrated in FIG. 7, which are two rectangular ring shaped patterns of internal and outer circumferences. These patterns can also be formed in the same step.

Figure 8:
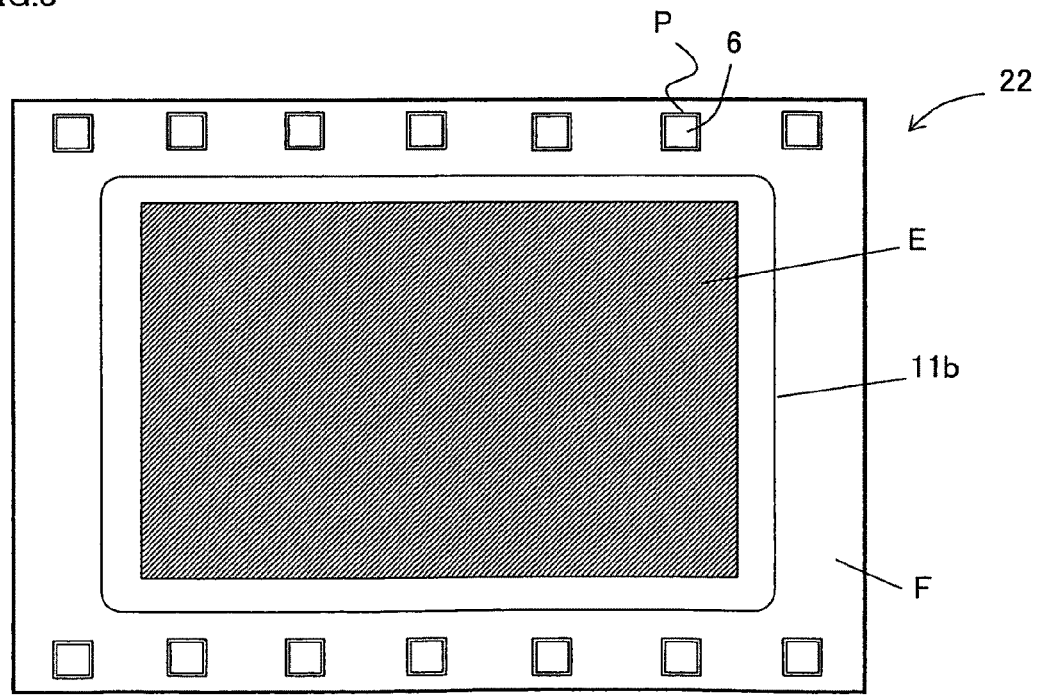
FIG. 8 is a plan view schematically illustrating still another exemplary essential structure (one narrow protection film removing pattern) related to Embodiment 1 of the solid-state image capturing device in FIG. 1.
Figure 9:
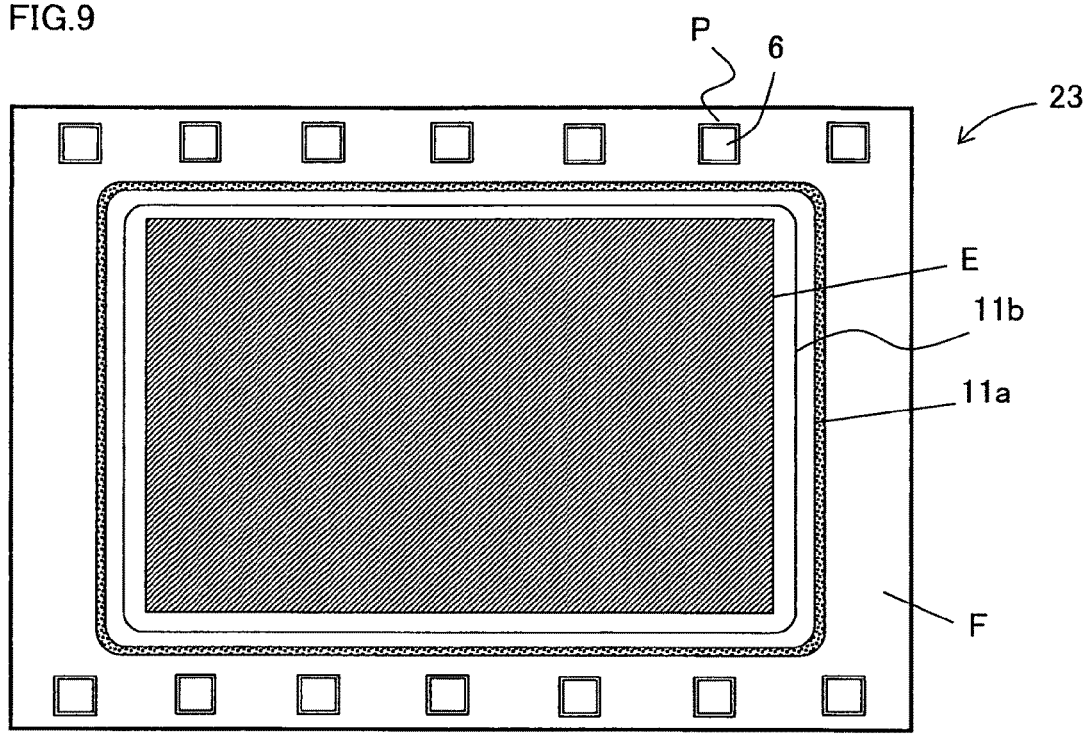
FIG. 9 is a plan view schematically illustrating still another exemplary essential structure (a combination of one narrow protection film removing pattern and one wide protection film removing pattern) related to Embodiment 1 of the solid-state image capturing device in FIG. 1.
Figure 10:
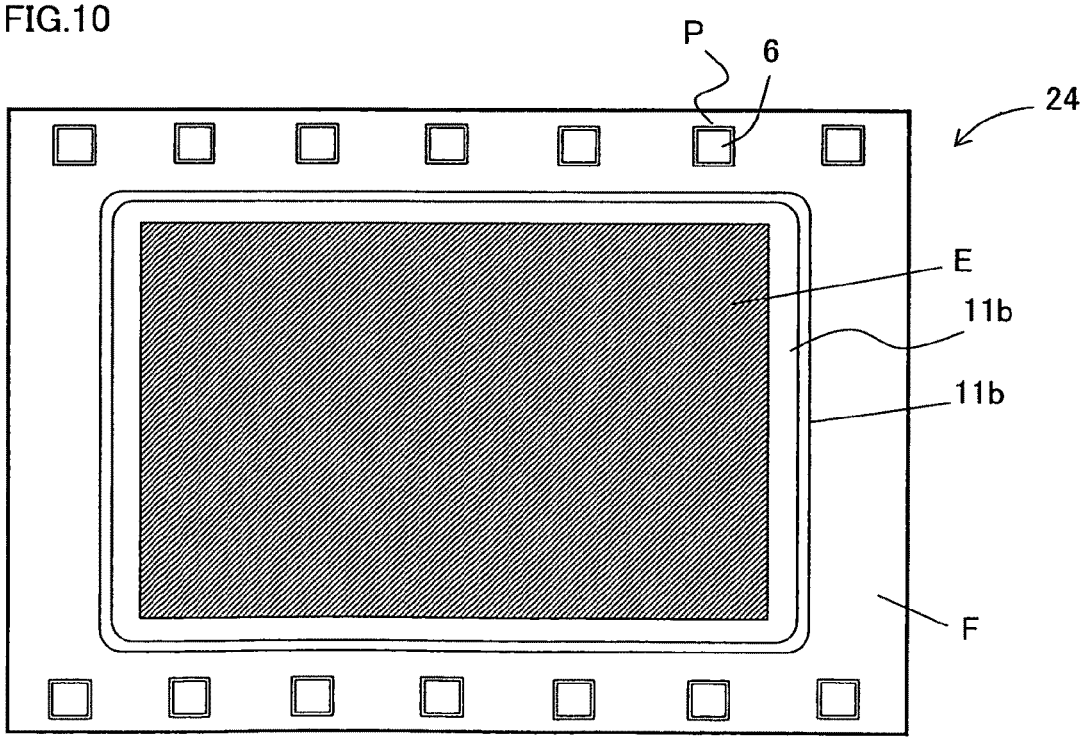
FIG. 10 is a plan view schematically illustrating still another exemplary essential structure (two narrow protection film removing patterns) related to Embodiment 1 of the solid-state image capturing device in FIG. 1.

In addition, the width of the protection film removing pattern 11*a*, which is a belt-shaped pattern surrounding all the image capturing area with a predetermined width, is determined from 1 to 10 µm. However, when a rectangular ring shaped pattern having a narrow width within this range is determined as a protection film removing pattern 11*b*, such one narrow protection film removing pattern 11*b* may be formed surrounding all the image capturing area with a predetermined width as illustrated in a solid-state image capturing device 22 in FIG. 8, for example. Further, a plurality of protection film removing patterns 11*b* surrounding all the image capturing area with a predetermined width may be formed, which are two rectangular ring shaped patterns of inner and outer circumferences, as illustrated in a solid-state image capturing device 24 in FIG. 10, for example. This pattern can also be formed in the same step. Further, it is desirable for the belt-shaped pattern to be as narrow as possible for the space. Further, a wide protection film removing pattern 11*a* and a narrow protection film removing pattern 11*b* may be combined together for the space. For example, a plurality of wide protection film removing pattern 11*a* and narrow protection film removing pattern 11*b* may be formed, as illustrated in a solid-state image capturing device 23 of FIG. 9 with each inner and outer circumferences of a wide protection film removing pattern 11*a* and narrow protection film removing pattern 11*b*. This pattern can also be formed in the same step.

Embodiment 2

In Embodiment 2, a protection film removing pattern will be described, where patterns (a plurality of opening patterns P) of an organic film above the electrode pad 6 only exists at specific edges (upper and lower edges, for example) above a solid-state image capturing chip (solid-state image capturing device).

Figure 11:
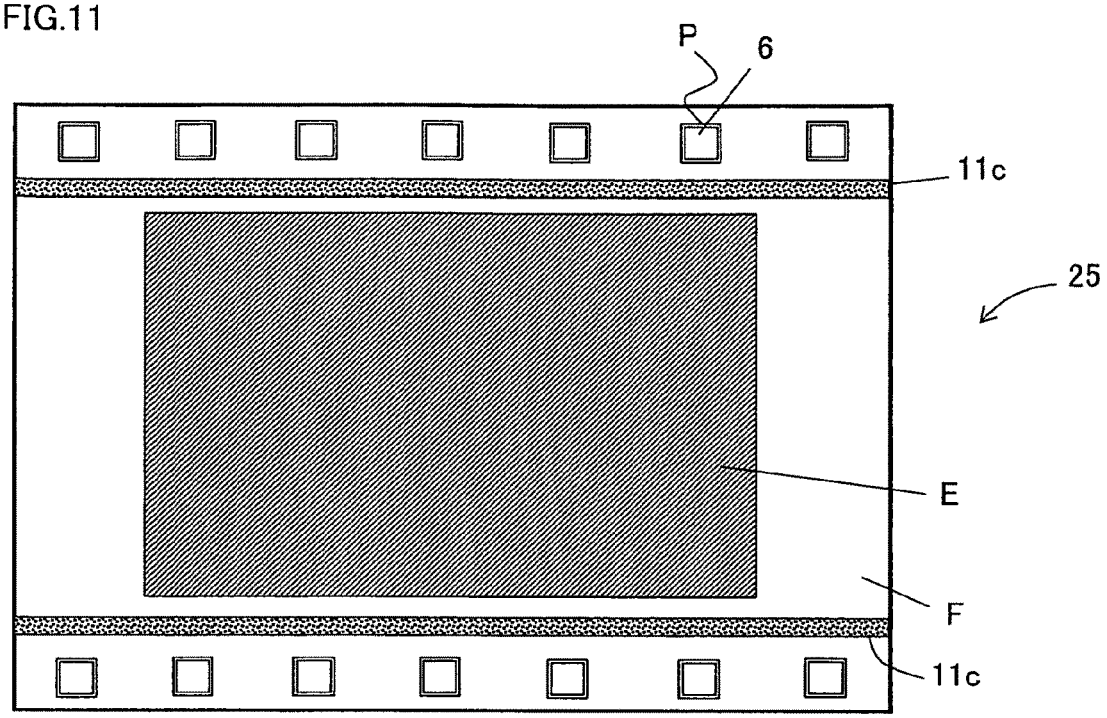
FIG. 11 is a plan view schematically illustrating an exemplary essential structure related to Embodiment 2 of the solid-state image capturing device according to the present invention.

FIG. 11 is a plan view schematically illustrating an exemplary essential structure related to Embodiment 2 of the solid-state image capturing device according to the present invention. Note that members having similar function and effect as the members in FIGS. 1 and 2 are denoted with the same reference numbers. In addition, note that the method for manufacturing the solid-state image capturing device is similar to the case in FIGS. 3 to 6.

In FIG. 11, a solid-state image capturing device 25 according to Embodiment 2 includes: a plurality of photoelectric conversion elements 2, which are provided in an effective image capturing pixel area E that is an image capturing area inside an ineffective pixel area F of a chip's outer circumference edge section; a plurality of electrode pads 6, which are provided only at specified edges (upper and lower edges, for example) above a solid-state image capturing chip (solid-state image capturing device), for inputting and outputting a signal from and to the outside; planarization films 7 and 9 for planarizing the difference in the level on the surface above the plurality of photoelectric conversion elements 2; microlenses 10 for focusing incident light on the plurality of photoelectric conversion elements 2; and a protection film 11 provided above the microlenses 10 and the planarization film 9. The planarization films 7 and 9 and the protection film 11 above the plurality of electrode pads 6 are removed as openings (opening pattern P).

The protection film 11 is removed by a protection film removing pattern 11*c* with a predetermined width (1 to 10 µm) crossing rectilinearly between the plurality of electrode pads 6 and a forming area (effective image capturing pixel area E) of the plurality of photoelectric conversion elements 2. The belt-shaped and rectilinearly shaped protection film removing pattern 11*c* (protection film removing area) removes only the protection film 11 above the planarization film 9, and the planarization film 7 or 9 is not removed. Further, the protection film removing pattern 11*c* is provided rectilinearly crossing between the opening pattern P and the image capturing area (effective image capturing pixel area E), so that the crack X will not stretch in the forming area (effective image capturing pixel area E) of the plurality of photoelectric conversion elements 2.

The protection film 11 above the microlens 10 is used for not only the protection function but also as a reflection preventing film (=silicon oxide film). The protection film 1 controls the reflection on the microlens surface by laminating a material film having a refractive index lower than the microlens material (transparent organic material with refractive index of 1.6) As a result, a focusing light effect, which can increase light focused on the photoelectric conversion element 2 (photodiode), is improved. As such a reflection preventing film, a silicon oxide film with a refraction index of 1.45 is laminated by the CVD method and the like.

Figure 12:
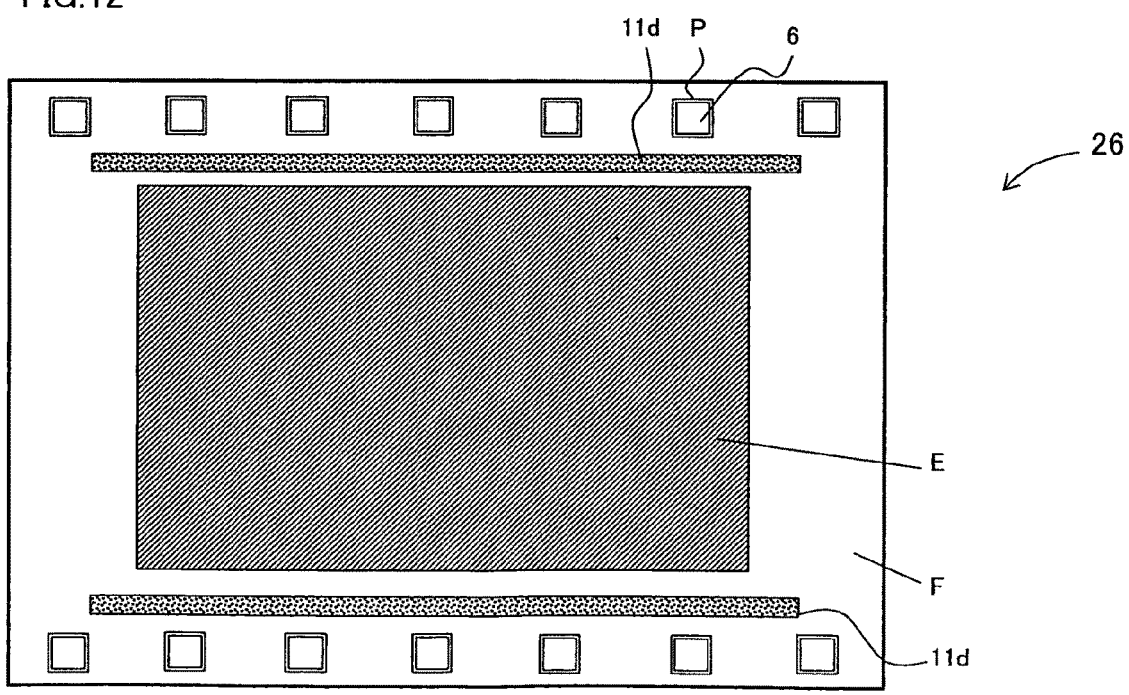
FIG. 12 is a plan view schematically illustrating another exemplary essential structure related to Embodiment 2 of the solid-state image capturing device according to the present invention.

In Embodiment 2, the rectilinear protection film removing pattern 11c described above is a belt-shaped pattern, which is positioned rectilinearly crossing with a predetermined width between each opening pattern P (opening section) above the plurality of electrode pads 6 and the image capturing area (effective image capturing pixel area E), and as illustrated in FIG. 11, a case has been described where the pattern is provided across one edge to the other edge that face each other. However, without the limitation to this, a removing pattern can be like a rectilinear protection film removing pattern 11d as illustrated in the solid-state image capturing device 26 of FIG. 12, which is not extended from one edge to the other edge and ends in the middle of the chip's edge, as long as the crack X can be stopped from stretching into the image capturing area (effective image capturing pixel area E). For example, the length of the removing pattern may be enough as long as the both end sections are extended at least up to and including the inside of the opening pattern P (opening section) above each electrode pad 6 at the both end sections of a series of the plurality of electrode pads 6, such as the protection film removing pattern 11d.

Embodiment 3

In Embodiment 3, a belt-shaped pattern will be described, where a protection film removing pattern 11e, which will be described later, surrounds a corner portion of an opening pattern P from the side of the image capturing area.

Figure 13:
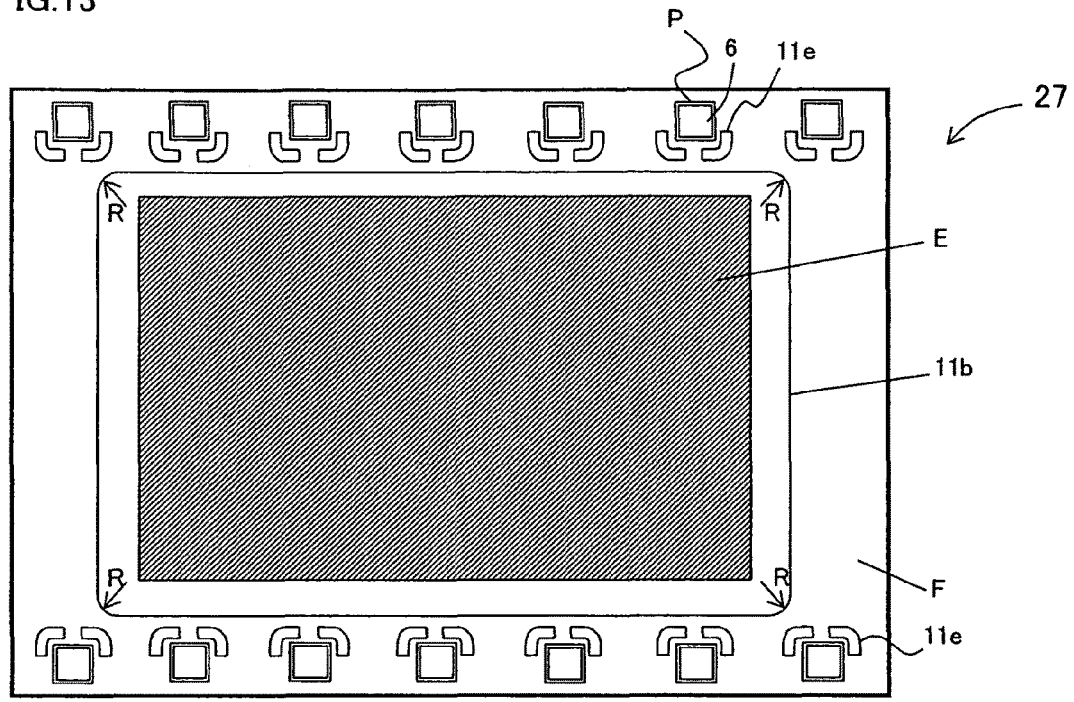
FIG. 13 is a plan view schematically illustrating an exemplary essential structure related to Embodiment 3 of the solid-state image capturing device according to the present invention.

FIG. 13 is a plan view schematically illustrating an exemplary essential structure related to Embodiment 3 of the solid-state image capturing device according to the present invention. Note that members having similar function and effect as the members in FIGS. 1 and 2 are denoted with the same reference numbers. In addition, note that the method for manufacturing the solid-state image capturing device is similar to the case in FIGS. 3 to 6.

In FIG. 13, a solid-state image capturing device 27 according to Embodiment 3 includes: a plurality of photoelectric conversion elements 2, which are provided in an effective image capturing pixel area E that is an image capturing area inside an ineffective pixel area F of a chip's outer circumference edge section; a plurality of electrode pads 6, which are provided at edges (upper and lower edges, for example) above a solid-state image capturing chip (solid-state image capturing device); planarization films 7 and 9 for planarizing the difference in the level on the surface above the plurality of photoelectric conversion elements 2; microlenses 10 for focusing incident light on the plurality of photoelectric conversion elements 2; and a protection film 11 provided above the microlenses 10 and the planarization film 9. The planarization films 7 and 9 and the protection film 11 above the plurality of electrode pads 6 are removed as openings (opening pattern P).

Since the crack X occurs from the corner portion of the opening pattern P above the respective plurality of electrode pads 6, the protection film 11 is removed by the protection film removing pattern 11e with a predetermined width (1 to 10 μm) in a round-cornered L-letter shape in such a manner to surround the corner portion of the opening pattern P above the electrode pad 6 when there is not an enough space in the ineffective area F. This belt-shaped and L-letter shaped protection film removing pattern 11e (protection film removing area) removes only the protection film 11 above the planarization film 9, and the planarization films 7 and 9 are not removed. In addition, the protection film removing pattern 11e is provided at a position near the opening pattern P between the opening pattern P and the image capturing area (effective image capturing pixel area E), so that the crack X will not stretch into the forming area (effective image capturing pixel area E) of the plurality of photoelectric conversion elements 2.

The protection film 11 above the microlens 10 is used for not only the protection function but also as a reflection preventing film (=silicon oxide film). The protection film 11 controls the reflection on the microlens surface by laminating a material film having a refractive index lower than the microlens material (transparent organic material with refractive index of 1.6). As a result, a focusing light effect, which can increase light focused on the photoelectric conversion element 2 (photodiode), is improved. As such a reflection preventing film, a silicon oxide film with a refraction index of 1.45 is laminated by the CVD method and the like.

Embodiment 4

In Embodiment 4, a case will be described where a protection film removing pattern 11f, which will be described later, is an area that includes an opening pattern P (opening section).

Figure 14:
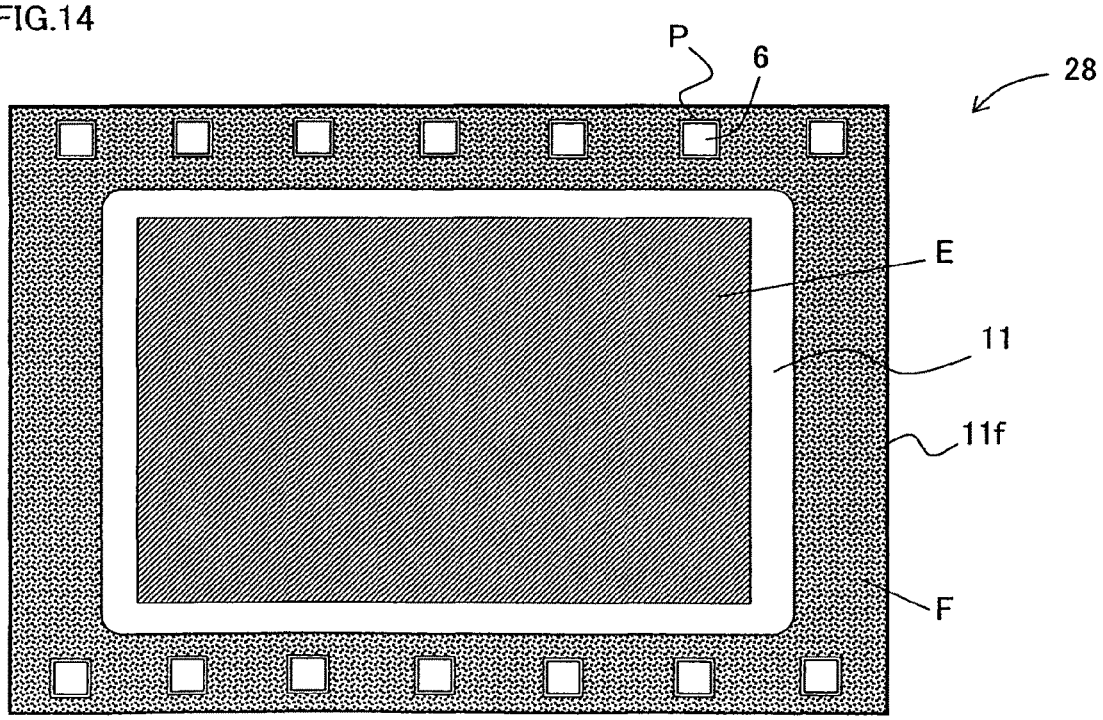
FIG. 14 is a plan view schematically illustrating an exemplary essential structure related to Embodiment 4 of the solid-state image capturing device according to the present invention.

FIG. 14 is a plan view schematically illustrating an exemplary essential structure related to Embodiment 4 of the solid-state image capturing device according to the present invention. Note that members having similar function and effect as the members in FIGS. 1 and 2 are denoted with the same reference numbers. In addition, note that the method for manufacturing the solid-state image capturing device is similar to the case in FIGS. 3 to 6.

In FIG. 14, a solid-state image capturing device 28 according to Embodiment 4 includes: a plurality of photoelectric conversion elements 2, which are provided in an effective image capturing pixel area E that is an image capturing area inside an ineffective pixel area F of a chip's outer circumference edge section; a plurality of electrode pads 6, which are provided at edges (upper and lower edges, for example) above a solid-state image capturing chip (solid-state image capturing device); planarization films 7 and 9 for planarizing the difference in the level on the surface above the plurality of photoelectric conversion elements 2; microlenses 10 for focusing incident light on the plurality of photoelectric conversion elements 2; and a protection film 11 provided above the microlenses 10 and the planarization film 9. The planarization films 7 and 9 and the protection film 11 above the plurality of electrode pads 6 are removed as openings (opening pattern P).

In the protection film 11, since the crack X occurs from the corner portion of the opening pattern P above the respective plurality of electrode pads 6, all the protection film area is removed outside the imaginary line crossing between the opening pattern P and the image capturing area (effective image capturing pixel area E) to be the protection film removing pattern 11f when there is not enough space in the ineffective area F. Herein, the protection film removing pattern 11f (protection film removing area) is an area including the opening pattern P outside the imaginary line that surrounds all the image capturing area (effective image capturing pixel area E). In addition, the protection film removing pattern 11f (protection film removing area) removes the protection film 11 above the planarization film 9, and the planarization film 7 or 9 is not removed. In addition, the protection film removing pattern 11f totally removes the outside of the imaginary line between the opening pattern P and the image capturing area (effective image capturing pixel area E), so that the crack X will not stretch into the forming area (effective image capturing pixel area E) of the plurality of photoelectric conversion elements 2.

On the other hand, the protection film 11 above the microlens 10 is used for not only the protection function but also as a reflection preventing film (=silicon oxide film). The protection film 11 controls the reflection on the microlens surface by laminating a material film having a refractive index lower than the microlens material (transparent organic material with refractive index of 1.6). As a result, a focusing light effect, which can increase light focused on the photoelectric conversion element 2 (photodiode), is improved. As such a reflection preventing film, a silicon oxide film with a refraction index of 1.45 is laminated by the CVD method and the like.

Figure 15:
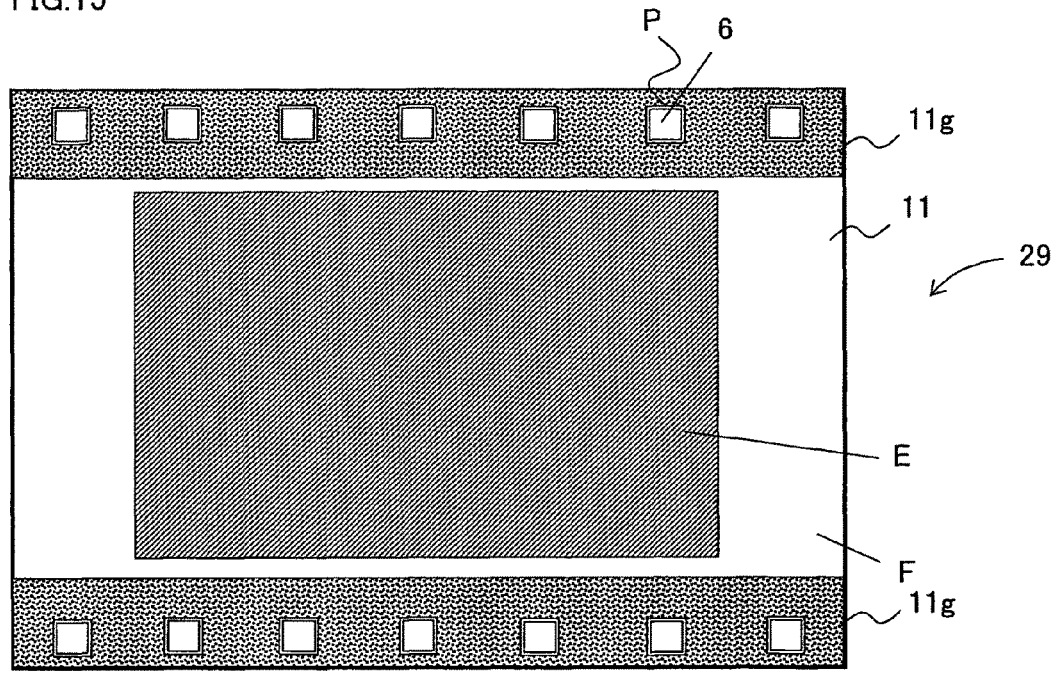
FIG. 15 is a plan view schematically illustrating another exemplary essential structure related to Embodiment 4 of the solid-state image capturing device according to the present invention.
Figure 16:
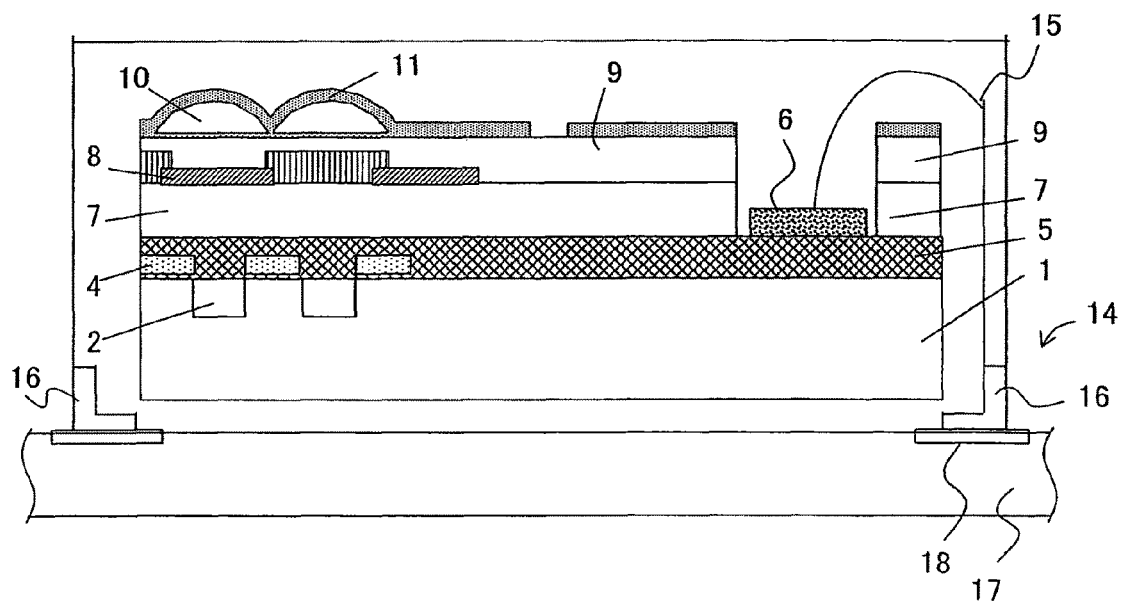
FIG. 16 is a main part longitudinal cross sectional view schematically illustrating a reflow soldering step of a camera module in order to describe the effect of Embodiments 1 to 4 of the solid-state image capturing device according to the present invention.

In Embodiment 4, the protection film removing pattern 11f has been described as an area including the opening pattern P outside the imaginary line that successively surrounds the entire periphery of the image capturing area. However, without the limitation to this, it is all right as long as the protection film removing pattern is an area that includes the opening pattern P (opening section). For example, as illustrated in a solid-state image capturing device 29 of FIG. 15, a protection film removing pattern 11g (protection film removing area) may be an area that includes the opening pattern P outside the imaginary line rectilinearly crossing between the opening pattern P above the plurality of electrode pads 6 and the image capturing area (effective image capturing pixel area E).

Although not specifically described in Embodiments 1 to 4, the protection film removing patterns 11a to 11g may be combined.

Herein, the effect of Embodiments 1 to 4 will be described.

Among makers that use the solid-state image capturing devices 21 to 29 according to Embodiments 1 to 4 described above, many of them desire reflow soldering for the purpose of downsizing of a product and an automation of installing. The reflow soldering is performed by mounting a terminal 16, which is taken out by wire-bonding a wire 15 from the electrode pad 6 of any of the packaged solid-state image capturing devices 21 to 29 to a terminal 18 on a substrate 17 with solder, and putting them in a high temperature tank (not shown) with a high temperature at which the microlens surface is bearable and soldering can be performed. As a result, any one of the solid-state image capturing devices 21 to 29 is packaged as a camera module 14 and reflow soldering is performed with a substrate terminal 18.

As described above, the whole package is put in the high temperature atmosphere, so that the terminal 16 on a lower surface of a resin mold package (or a ceramic package) is die-bonded to the terminal 18 on the substrate 17 as the camera module 14. The package is a legless type, and the package is placed and heated on a land (terminal 18) of the substrate 17. Thus, the organic film below the protection film is soft, while the protection film 11 such as an oxide film above the organic film is inorganic, thin and hard, thereby easy to break, and even when a strong heat stress is applied and the crack X occurs and stretches, the protection film 11 has a protection film removing area that at least includes a removed area across all or the corner portion of the opening pattern P above the electrode pad and the image capturing area, thereby certainly stopping the stretching of the crack X in the protection film removing area.

Embodiment 5

Figure 17:
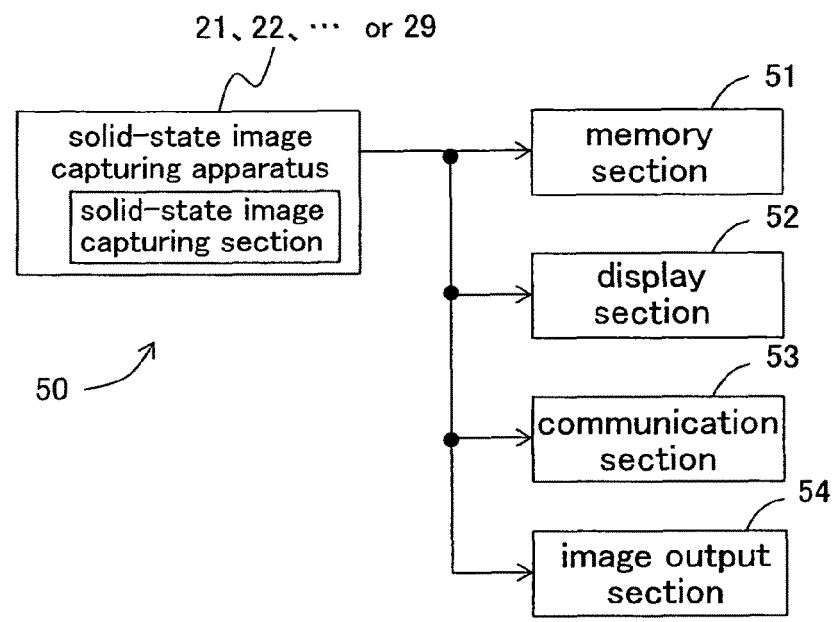
FIG. 17 is a block diagram illustrating an exemplary diagrammatic structure of an electronic information device, such as car-mounted camera and camera-equipped cell phone device, as Embodiment 5 of the present invention, using any solid-state image capturing device according to any of Embodiments 1 to 4 of the present invention as an image input device in an image capturing section.
Figure 18:
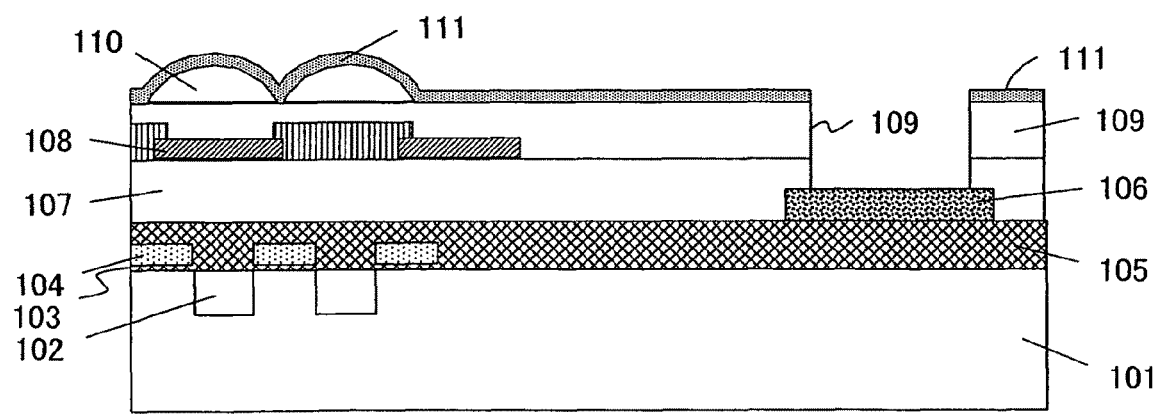
FIG. 18 is a cross sectional view schematically illustrating an exemplary essential structure of the conventional solid-state image capturing device.
Figure 19:
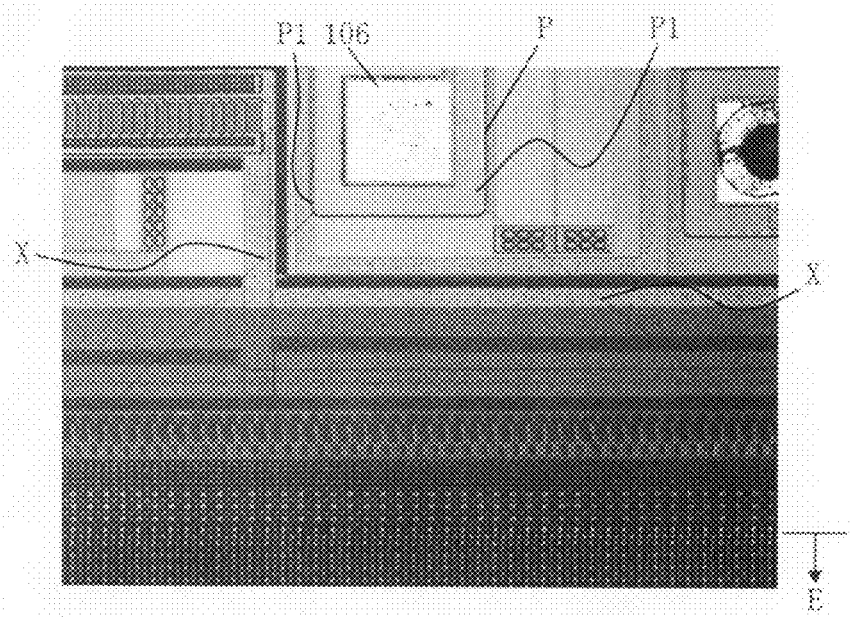
FIG. 19 is a main part plan view illustrating an optical microscope photograph in order to describe a linear crack of a protection film in the conventional solid-state image capturing device.
Figure 20:
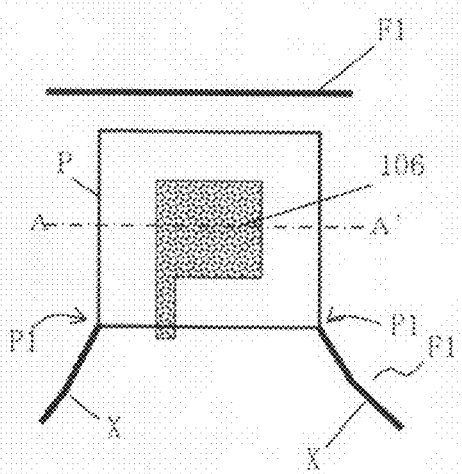
FIG. 20 is an enlarged plan view illustrating a pattern opened larger than an electrode pad in the conventional solid-state image capturing device, as an actually used pattern.
Figure 21:
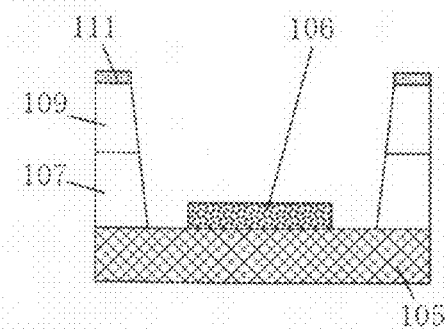
FIG. 21 is a cross sectional view along the line A-A' of FIG. 16.
Figure 22:
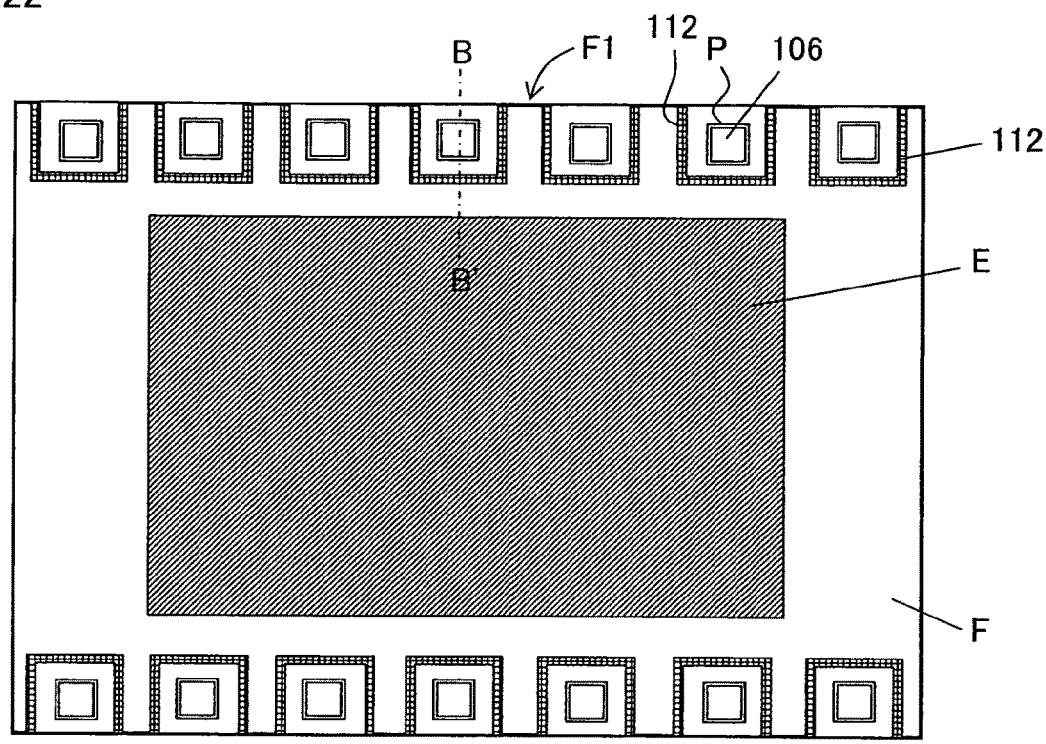
FIG. 22 is a plan view schematically illustrating a case where a microlens pattern is positioned in an ineffective pixel area between an electrode pad and an effective pixel area in the conventional solid-state image capturing device, in order to prevent a linear crack from stretching.
Figure 23:
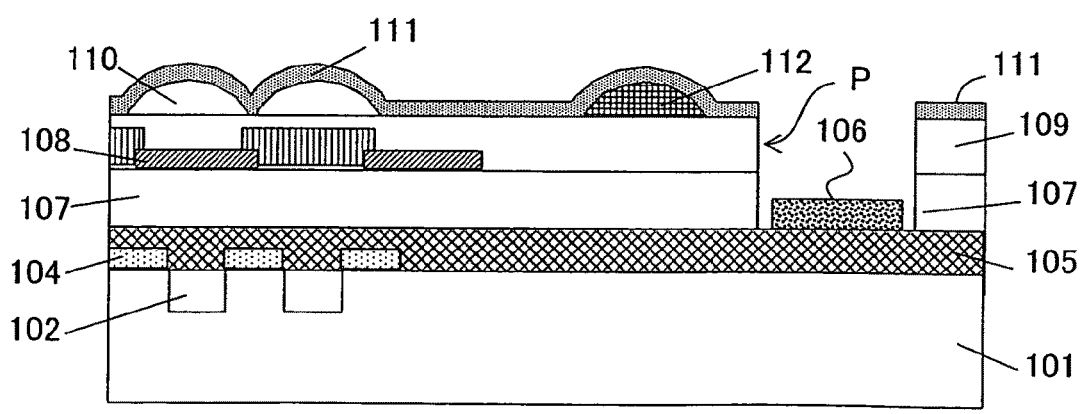
FIG. 23 is a cross sectional view along the line B-B' of FIG. 18.

FIG. 17 is a block diagram illustrating an exemplary diagrammatic structure of an electronic information device, such as car-mounted camera and camera-equipped cell phone device, as Embodiment 5 of the present invention, using any solid-state image capturing device according to any of Embodiments 1 to 4 of the present invention as an image input device in an image capturing section.

In FIG. 17, the electronic information device 50 according to Embodiment 5 of the present invention includes: any of the color solid-state image capturing devices 21 to 29 according to Embodiments 1 to 4; a memory section 51 (e.g., recording media) for data-recording the color image signal from the solid-state image capturing apparatus for processing an image capturing signal from any of the color solid-state image capturing devices 21 to 29 after a predetermined signal process is performed on the color image signal for recording; a display section 52 (e.g., a color liquid crystal display apparatus) for displaying the color image signal from any of the solid-state image capturing devices 21 to 29 on a display screen (e.g., liquid crystal display screen) after predetermined signal processing is performed on the color image signal for display; a communication section 53 (e.g., a transmitting and receiving device) for communicating the color image signal from any of the color solid-state image capturing devices 21 to 29 after predetermined signal processing is performed on the color image signal for communication; and an image output section 54 for printing the color image signal from any of the color solid-state image capturing devices 21 to 29 after predetermined signal processing is performed for printing. Thus, the electronic information device 50 according to Embodiment 5 may include all of the memory section 51, the display section 52, the communication section 53, and the image output section 54. Without any limitations to this, the electronic information device may include at least any of these sections.

An electronic information device that has an image input device is conceivable, as the electronic information device 50, such as a digital camera (e.g., digital video camera and digital still camera), an image input camera (e.g., a monitoring camera, a door phone camera, a camera equipped in a vehicle (for back view or monitoring), and a television telephone camera), a scanner, a television telephone device, a facsimile machine and a camera-equipped cell phone device.

Therefore, according to Embodiment 5 of the present invention, the color image signal from the color solid-state image capturing devices 21 to 29 can be: displayed on a display screen finely; printed out on a sheet of paper using an image output section 54; communicated finely as communication data via a wire or a radio; and stored finely at the memory section 51 by performing predetermined data compression processing, and various data processes can be finely performed.

Although not specifically described in Embodiments 1 to 4, a structure provided with a microlens pattern formed with the same material as the microlens 10 and in the same microlens forming step may be added to Embodiments 1 to 4, the structure surrounding the periphery of the opening pattern P above the electrode pad 6.

Further, although not specifically described in Embodiments 1 to 4, any of the color solid-state image capturing devices 21 to 29 may be a CCD-type solid-state image capturing device or a CMOS-type solid-state image capturing device.

As described above, the present invention is exemplified by the use of its preferred Embodiments 1 to 5. However, the present invention should not be interpreted solely based on Embodiments 1 to 5 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

Industrial Applicability

The present invention can be applied in the field of a solid-state image capturing device for performing photoelectric conversions on and capturing image light from a subject, a camera module, and an electronic information device, such as a digital camera (e.g., digital video camera and digital still camera), an image input camera (e.g., car-equipped monitoring camera), a scanner, a facsimile machine, and a camera-equipped cell phone device used in an image capturing section as an image input device. According to the present invention with the structure described above, the organic film (planarization film) below the protection film is soft, while the protection film such as an oxide film above the organic film is inorganic, thin and hard, thereby easy to break. Even when the crack X reaches the protection film and the crack X stretches, and even when a strong heat stress is applied in the protection film removing area, it is certainly stopped in the protection film removing area because the protection film at least includes a removed area across all or the corner portion of the opening pattern P above the electrode pad and the image capturing area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing device, comprising a plurality of electrode pads provided in an outer circumference edge section of a semiconductor substrate, for inputting and outputting a signal or voltage from and to the outside; a plurality of photoelectric conversion elements provided in an image capturing area inside the outer circumference edge section of the semiconductor substrate; a planarization film for planarizing the difference in level on the surface above the plurality of photoelectric conversion elements; a microlens provided above the planarization film, for focusing incident light on each of the plurality of photoelectric conversion elements; and a protection film provided above the microlens and the planarization film, the planarization film and the protection film above the plurality of electrode pads being removed so as to form an opening, wherein the protection film has a protection film removing area that at least includes an area located between the opening and the image capturing area, and is separate from the opening.

2. A solid-state image capturing device according to claim 1, wherein only a protection film above the planarization film is removed in the protection film removing area.

3. A solid-state image capturing device according to claim 1, wherein a pattern of the protection film removing area is a belt-shaped pattern surrounding all the image capturing area with a predetermined width.

4. A solid-state image capturing device according to claim 1, wherein a pattern of the protection film removing area is a belt-shaped pattern positioned linearly crossing a predetermined width between the plurality of electrode pads and the image capturing area.

5. A solid-state image capturing device according to claim 4, wherein the belt-shaped pattern is provided along one edge to the other edge that face each other.

6. A solid-state image capturing device according to claim 1, wherein a pattern of the protection film removing area is a belt-shaped pattern surrounding a corner portion of the side of the image capturing area in the opening with a predetermined width.

7. A solid-state image capturing device according to claim 3, wherein the belt-shaped pattern has the predetermined width of 1 to 10 μm.

8. A solid-state image capturing device according to claim 4, wherein the belt-shaped pattern has the predetermined width of 1 to 10 μm.

9. A solid-state image capturing device according to claim 6, wherein the belt-shaped pattern has the predetermined width of 1 to 10 μm.

10. A solid-state image capturing device according to claim 1, wherein a pattern of the protection film removing area is an area including the opening.

11. A solid-state image capturing device according to claim 10, wherein the area including the opening is an area outside an imaginary line across the opening and the image capturing area.

12. A solid-state image capturing device according to claim 11, wherein the area including the opening is an area outside an imaginary line surrounding all the image capturing area.

13. A solid-state image capturing device according to claim 11, wherein the area including the opening is an area outside an imaginary line linearly crossing the opening above the plurality of electrode pads and the image capturing area.

14. A solid-state image capturing device according to claim 3, wherein a corner portion of a pattern of the protection film removing area has a curve with a radius of about 1 to 10 μm.

15. A solid-state image capturing device according to claim 6, wherein a corner portion of a pattern of the protection film removing area has a curve with a radius of about 1 to 10 μm.

16. A solid-state image capturing device according to claim 12, wherein a corner portion of a pattern of the protection film removing area has a curve of about 1 to 10 μm.

17. A solid-state image capturing device according to claim 1, wherein the protection film is a reflection film that also has a reflection preventing function.

18. A solid-state image capturing device according to claim 1, wherein the protection film is a passivation film that also has a function to prevent the passage of water.

19. A solid-state image capturing device according to claim 17, wherein the reflection preventing film is a film formed of a material with a refractive index lower than the refractive index of a transparent organic material as a material of the microlens.

20. A solid-state image capturing device according to claim 17, wherein the reflection preventing film is an organic or inorganic, SOG (Spin on Glass) film or $SiO_2$ film.

21. A solid-state image capturing device according to claim 18, wherein the passivation film is at least either a SiN film or an SiON film.

22. A solid-state image capturing device according to claim 1, wherein the opening is square or rectangle in a plan view.

23. A solid-state image capturing device according to claim 1, wherein the solid-state image capturing device is provided with a microlens pattern having the same material as the microlens and provided in the same microlens forming step, in such a manner to surround the periphery of the opening above the electrode pad.

24. A camera module in which the solid-state image capturing device according to claim 1 is packaged and reflow soldering is performed with a substrate terminal.

25. An electronic information device using the solid-state image capturing device according to claim 1 as an image input device in an image capturing section.

* * * * *